(12) United States Patent
Wong et al.

(10) Patent No.: US 7,920,798 B2
(45) Date of Patent: Apr. 5, 2011

(54) PON BURST MODE RECEIVER WITH FAST DECISION THRESHOLD SETTING

(75) Inventors: Thomas S. Wong, San Jose, CA (US); Katherine T. Hoang, Milpitas, CA (US)

(73) Assignee: Micrel, Inc., San Jose, CA (US)

( * ) Notice: Subject to any disclaimer, the term of this patent is extended or adjusted under 35 U.S.C. 154(b) by 889 days.

(21) Appl. No.: 11/764,419

(22) Filed: Jun. 18, 2007

(65) Prior Publication Data

US 2008/0310861 A1    Dec. 18, 2008

(51) Int. Cl.
*H04B 10/06* (2006.01)
(52) U.S. Cl. ............................... 398/210; 398/208
(58) Field of Classification Search ............ 398/210, 398/208
See application file for complete search history.

(56) References Cited

U.S. PATENT DOCUMENTS

| | | | |
|---|---|---|---|
| 2003/0067662 A1* | 4/2003 | Brewer et al. | 359/189 |
| 2003/0086516 A1* | 5/2003 | Wagner | 375/350 |
| 2003/0092411 A1* | 5/2003 | Ivry | 455/232.1 |
| 2008/0212716 A1* | 9/2008 | Miremadi et al. | 375/319 |

OTHER PUBLICATIONS

Micrel SY88903AL data sheet, Feb. 2007 [online], retrieved on Jul. 12, 2010. Retrieved from the Internet <URL: http://www.micrel.com/_PDF/HBW/sy88903al.pdf>.*

* cited by examiner

*Primary Examiner* — Nathan M Curs
(74) *Attorney, Agent, or Firm* — Patent Law Group LLP

(57) ABSTRACT

A receiver converts an analog signal, derived from light pulses in a GPON fiber optic system, to clean digital electrical signals. A photodetector and transimpedance amplifier (TIA) convert the light pulses to analog electrical signals. A reset signal generated by a media access controller (MAC) in the GPON system signifies the start of a new burst of data. The receiver has a switchable low pass filter that establishes the threshold voltage for determining whether the analog signal is a logical 1 or a logical 0. At the very start of a new burst, the low pass filter has a fast time constant to quickly establish the threshold voltage for the burst. At a later time during the burst, the low pass filter is switched to have a slow time constant to create a relatively stable threshold voltage.

21 Claims, 6 Drawing Sheets

PON BURST MODE RECEIVER WITH FAST DECISION THRESHOLD SETTING

FIELD OF THE INVENTION

This invention relates to burst-mode digital receivers such as used in passive optical networks (PON) and, in particular, to a receiver that receives gigabit per second signals from multiple optical network units (ONUs) or other transmitters that generate signals having unknown transition levels.

BACKGROUND

PONs are used in point to multi-point communications applications. FIG. 1 illustrates a simple example of a PON 10. An optical line terminal (OLT) 12 is connected to the "head end" of the PON and is typically located in a local telephone exchange (a central office). The OLT 12 controls access to the shared PON and interconnects the PON with a wider telecommunications network. Examples of outside services connected to the PON may be cable television (CATV) 14, an Internet network 16 (for VoIP and data), and any other wide area network (WAN) 18. A connector bus or switch 19 connects the signals from the various services to the OLT 12 ports. The OLT 12 communicates with the bus 19 using serial or parallel electrical signals in well known formats.

The OLT 12 manages the incoming data from the outside sources, converts the data to light pulses, and transmits the data via one or more fiber optic cables to a plurality of optical network units (ONUs) 20, 21, 22, which are the user ends of the PON, typically up to 10 km downstream from the OLT 12. The ONUs are connected via wires to the ultimate users 23-25. The OLT 12 also manages optical transmissions from the ONUs 20-22 to the outside network. If the fiber were run all the way to a home or office building an Optical Network Termination (ONT) would be needed. Whether the termination is an ONU or an ONT is not relevant to the present invention.

A PON is very efficient since only passive splitters 28 are used in the fiber optic network. The splitters 28 couple the fiber optic cable 34 from the OLT 12 to each fiber optic cable 30-32 leading to an ONU 20-22. In a PON system, a light signal from a single fiber optic cable may be split into 64 or more fibers.

Standards for PON are described in various publications, such as ITU-T-G.984 (Gigabit PON). All these applicable standards are well-known to those skilled in the art and are incorporated by reference.

A transmitter 36 in the OLT 12 converts electrical data to light pulses using a laser diode. Light is transmitted by the OLT 12 to the ONUs at one wavelength, and light is transmitted by the ONUs back to the OLT at a different wavelength, so there is wavelength division multiplexing (WDM) in the PON.

A receiver 38 in the PON converts the optical signals received from the ONUs to electrical signals.

A media access controller (MAC) 40 controls the communications over the PON and the formatting of the data (e.g., packetizing, depacketizing, serial-parallel conversion, etc.). Data passing "upstream" over the PON from the ONUs to the OLT 12 are typically multiplexed according to a Time Division Multiple Access (TDMA) technique in which data channels are separated in time, using assigned time slots, to avoid collisions at the OLT 12. The OLT 12 transmits the data from the outside networks to the ONUs typically using a broadcast scheme, and the particular ONU having the destination address specified in the transmission then processes the data. The non-addressed ONUs ignore the transmission. Encryption is used for security.

The data coming from the ONUs is transmitted in packets using a certain protocol standard. Various protocols, known as Media Access Control (MAC) protocols, have been developed to control an ONU's upstream access to the shared capacity on a PON. MAC protocols may implement the TDMA multiplexing scheme in the upstream direction, or other packet-based data transfer schemes may be used that are more appropriate to especially high data rates or to a variable rate asymmetric data transport.

A typical PON configuration does not permit ONUs to communicate directly with each other and requires the MAC 40 to determine the order of transmissions and the time of transmission.

One popular type of MAC protocol described in the ITU standard for GPON specifies a minimum 32 bit guard time between packet cells to prevent collisions, a 44 bit preamble of alternating 1s and 0s for bit synchronization, a 20 bit delimiter to indicate the start of incoming payload data, followed by the fixed or variable length payload data. The payload data includes addresses and the primary data information. A simplified version of this protocol is illustrated in FIG. 2.

Since each ONU 20-22 is at a different distance from the OLT 12, the round trip time for a packet will be different for each ONU. The MAC 40 in the OLT 12 has a stable reference clock that is used for the processing of the incoming digital signals. Since it is important that the bits from all the ONUs be received by the OLT 12 in phase, the MAC 40 introduces a phase correction for each ONU to use when transmitting so that all the ONUs have the same constant equalized round trip delay. This is called ranging.

The MAC 40 in a GPON system issues a programmable reset signal shortly after the end of a packet burst to reset the protocol sequence and any other circuitry needing a reset. The reset pulse ends shortly before the preamble. The reset pulse occurs during the guard time between bursts of data. Such MACs are well known and commercially available.

With data rates of 1.25 and 2.5 gigabits per second, and with the magnitudes of the light pulses from each ONU being different, conversion of the pulses of light to error-free electrical digital signals is very difficult. In a PON receiver, a photodetector converts the magnitude of a light pulse to a proportional analog current. This current is converted into an analog voltage by a transimpedance amplifier (TIA), and the output of the transimpedance amplifier is applied to a limiting amplifier (such as a comparator) that determines whether the analog signal is a logical 1 or a logical 0 bit. (The term "analog" is used herein even though the data transmitted is digital because the amplitudes of the logical 1 and 0 bits are variable due to the different distances of the transmitters.) The limiting amplifier then outputs a clean and valid digital signal.

The threshold voltage of the analog signal that the limiting amplifier uses for determining whether the light pulse is a logical 1 or a logical 0 is difficult to quickly establish since the magnitude of the light pulses received by the OLT vary for each ONU. The threshold voltage is optimally the midpoint between the voltage amplitudes of a logical 1 and logical 0.

For example, FIG. 2 illustrates two simplified analog signals 44 and 46 outputted by the transimpedance amplifier for a "close" ONU 20 and for a "distant" ONU 22, respectively. The optimum threshold voltage level 48 for determining whether the signal is a logical 1 or a logical 0 is ideally the midpoint between the peak voltage and minimum voltage. At very high speeds, it is very difficult to quickly establish the threshold voltage at the midpoint, as this is often implemented using two peak detectors and a resistor divider to detect the minimum and peak values. Not setting the threshold at the midpoint increases the chances of bit errors.

In another possible technique, the threshold voltage for determining whether the analog signal is a logical 1 or a logical 0 may be derived by obtaining the average magnitude of the analog pulses over time. The average may be obtained using a low pass filter (e.g., a capacitor and resistor having an RC time constant) to extract the DC component (assumed to be the average) of the data stream. If the analog signal is above the average of the data stream, it is assumed to be a logical 1. However, to prevent a series of 1s or 0s from significantly varying the threshold voltage, the time constant of the low pass filter must be relatively long/slow. A long RC time constant would result in a relatively long time, starting at the beginning of a packet cell, to establish an average since the filter capacitor voltage begins at an arbitrary voltage resulting from a previous burst from a different ONU. This would result in a high error rate until the capacitor voltage stabilized.

What is needed is an improved technique for determining whether an analog signal in a high data rate PON system, or other digital burst-mode system, is a logical 1 or a logical 0.

SUMMARY

In one embodiment of the invention, a receiver converts an analog signal, derived from light pulses in a fiber optic system, to binary electrical signals. The receiver is particularly applicable for use in a GPON system, where the peak magnitude of the analog signal varies with the distance between the transmitter and the receiver. In the example used to describe the invention, the receiver is in the OLT.

A photodetector and burst-mode-capable transimpedance amplifier (TIA) convert the light pulses received from the ONUs to analog electrical signals.

In the GPON protocol standard, there is a specified guard time between consecutive bursts of data (packet cells), and the packet starts with 44 alternating 1s and 0s in a preamble for bit synchronization.

In one embodiment FIG. 3, a reset signal generated by the MAC in the OLT to signify the start of a new burst of data from an ONU is utilized by the receiver. The receiver has a switchable low pass filter coupled to the analog signal output from the TIA. In the example used, the switchable low pass filter comprises a capacitor and a switchable resistance. The low pass filter establishes the threshold voltage for determining whether the analog signal is a logical 1 or a logical 0. At the very start of a new packet, when a new ONU transmission is about to be received by the OLT, a reset signal (shown as reset 2), generated by using the reset signal from the MAC (shown as reset 1), is applied to a switch that couples a low resistance (e.g., 10 ohms) to a low pass filter capacitor to cause the low pass filter to have a fast RC time constant. This enables the capacitor to quickly establish the average voltage using the 44 preamble bits.

This average (substantially a DC voltage) is then applied to the inverting input of a limiting amplifier. A limiting amplifier operates as a comparator that outputs a digital voltage with predetermined high and low levels. As used herein, the term limiting amplifier refers to any circuit that triggers when its differential input signals substantially cross and outputs a digital signal with predetermined high and low levels. The limiting amplifier may have hysteresis.

The analog signal from the TIA is directly applied to the noninverting input of the burst-mode-capable limiting amplifier. The crossing of the average by the analog signal determines whether the limiting amplifier outputs a digital 1 or a digital 0 at, for example, a PECL level.

The fast RC time constant would be too short to derive the average voltage of the non-preamble data since a long string of 1s or 0s in the payload data would significantly affect the average voltage due to the much lower frequency component of the data. Therefore, once the average has stabilized during the preamble, the switch is disabled, allowing a relatively high resistance (e.g., 1K ohms) to couple to the filter capacitor and to greatly increase the time constant to create a relatively stable threshold voltage for the payload data.

Thus, the threshold voltage is quickly established during the preamble phase of the packet, and the threshold voltage becomes very stable prior to the payload data being received.

The invention can be applied to any receiving system that receives bursts of digital data where a benefit is obtained by quickly establishing a threshold, followed by stabilizing the threshold. Any type of low pass filter having a controllable time constant may be used.

The particular timing generator described herein for providing the switch signaling uses only five components so it is very small and efficient.

BRIEF DESCRIPTION OF THE DRAWINGS

Elements labeled with the same numeral in various figures may be identical.

DETAILED DESCRIPTION

Figure 1:
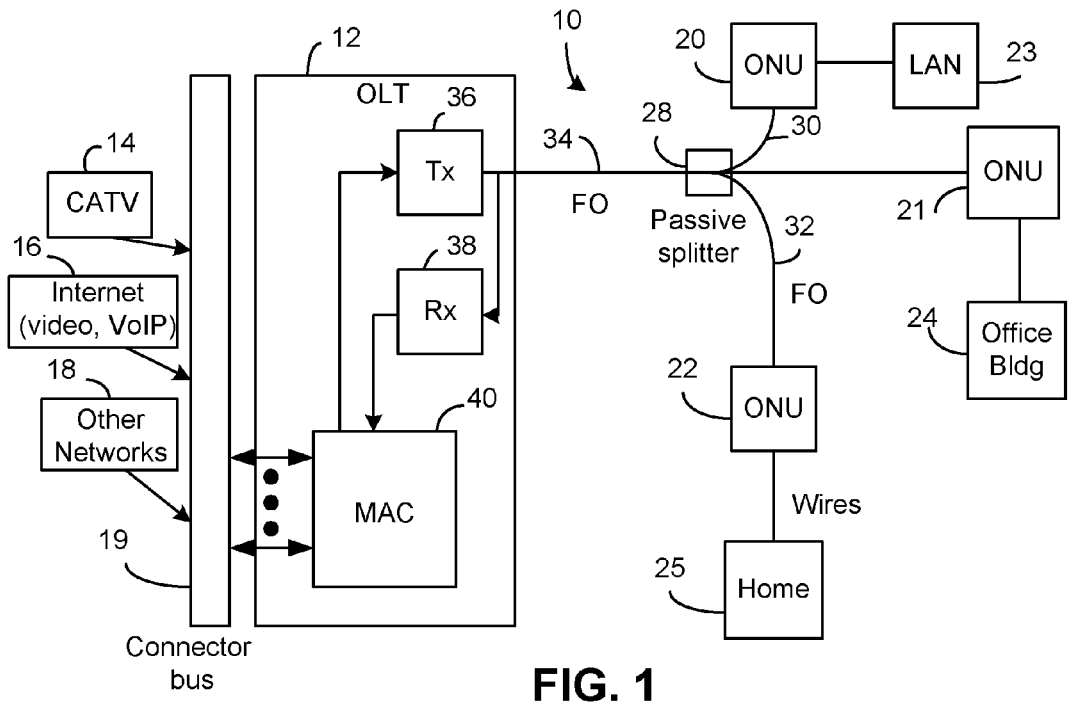
FIG. 1 illustrates a prior art PON system.
Figure 2:
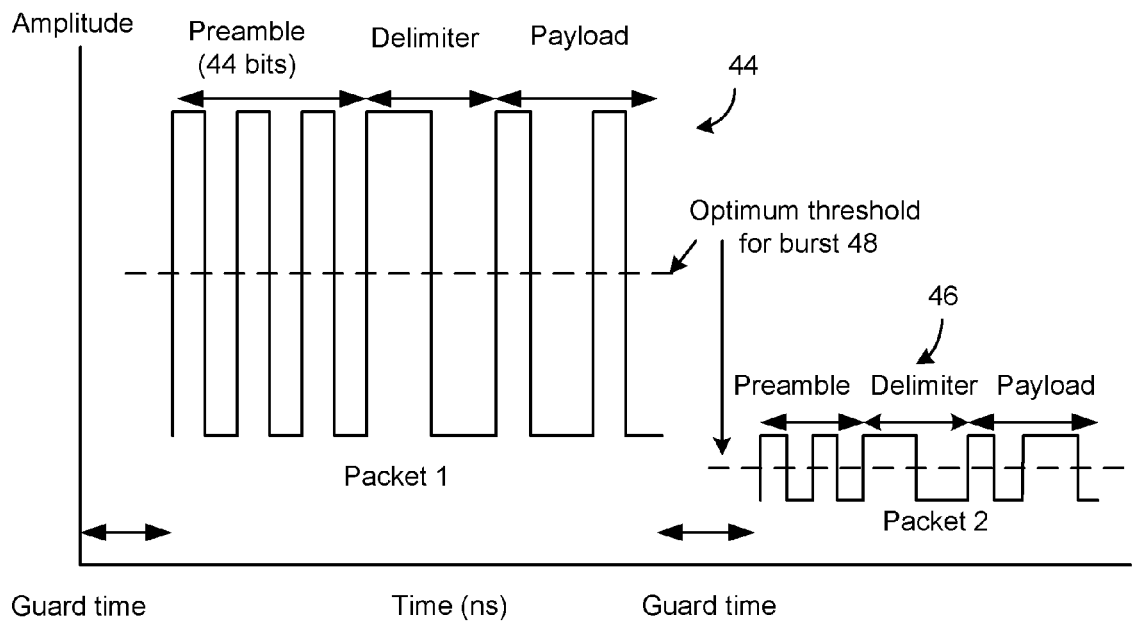
FIG. 2 illustrates two analog waveforms representing two different bursts received at the OLT from two ONUs, where the magnitudes of the signals are generally inversely proportional to the distance between the ONU and the OLT due to signal loss through the fiber and the number of splits in the PON.
Figure 3:
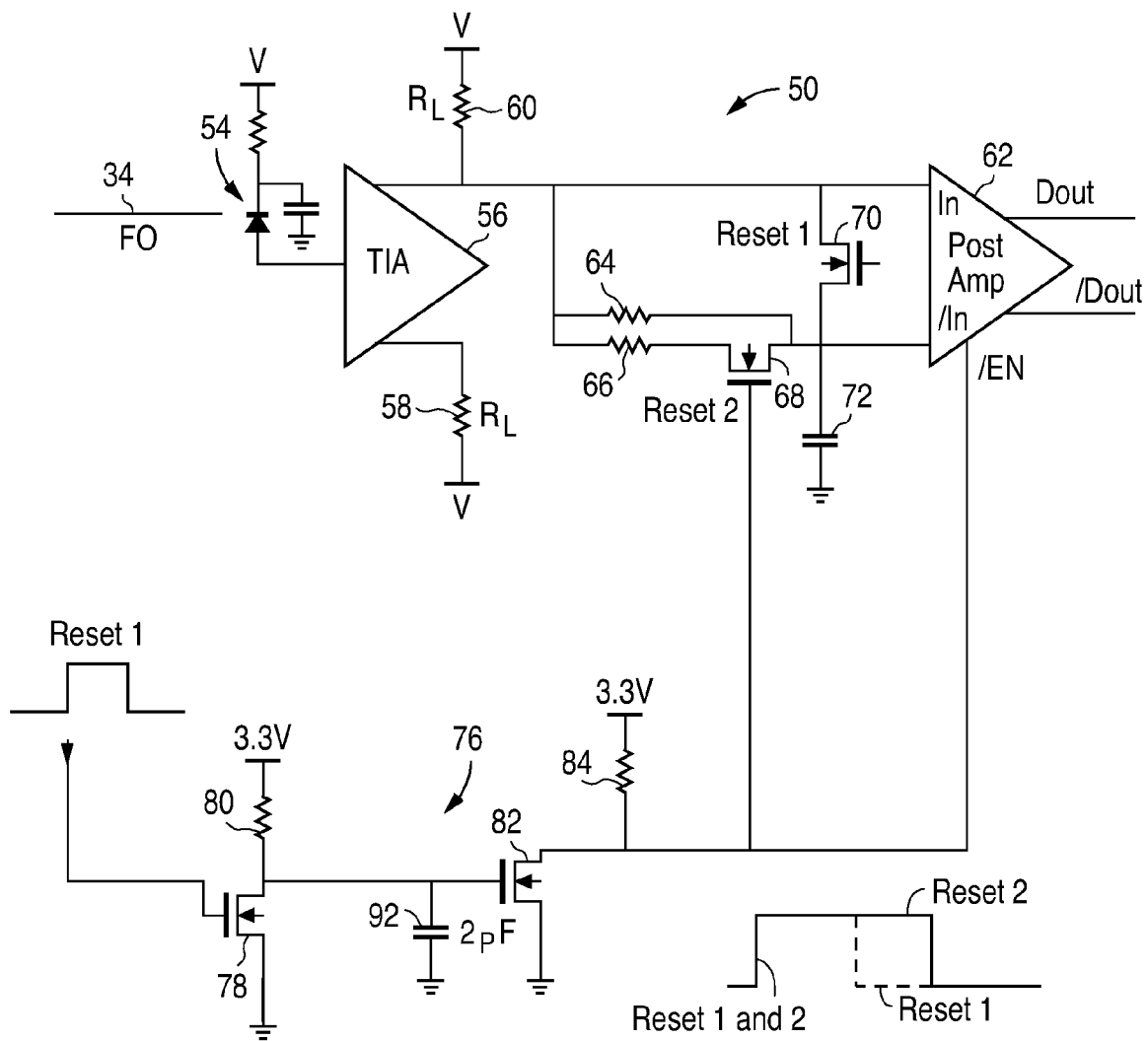
FIG. 3 is a schematic of a receiver in accordance with one embodiment of the invention that can be used as the receiver in the PON system of FIG. 1.

FIG. 3 illustrates one embodiment of a receiver 50, which may substitute for the receiver 38 in the GPON system 10 of FIG. 1.

A fiber optic cable 34 is terminated proximate to a photodetector 54. In FIG. 3, the photodetector 54 is a photodetector diode connected in a reverse bias configuration. An optical signal applied to the photodetector 54 causes the photodetector 54 to conduct a current proportional to the intensity of the optical signal. It is assumed the fiber optic cable 34 is coupled to receive bursts of data from the various ONUs in FIG. 1, where the ONUs transmit in assigned time slots determined by the MAC 40 of FIG. 1.

The pulses of analog current through the photodetector 54 are applied to the input of a transimpedance amplifier (TIA) 56. The TIA 56 is a high-speed burst-mode TIA that converts the current to a single-ended or differential analog voltage at its outputs. TIAs are well known. The TIA 56 in the example has a differential signal output. The inverting output of the TIA 56 is not used and is connected to a load resistor 58 for proper operation. The particular burst-mode TIA used in this example requires a load resistor, but other TIAs may not. Other high-speed TIAs that are burst-mode capable and support a DC-coupling interface would also work.

The non-inverting output of the TIA 56 is connected to a load resistor 60 and to a non-inverting input (In) of a limiting amplifier 62. Amplifier 62 is a burst-mode differential amplifier that outputs differential signals (Dout and /Dout) to be further processed by the MAC and other well-known circuits used in an OLT, such as clock and data recovery (CDR) circuits, registers, serial to-parallel converters, decoders, depacketizers, etc. Limiting amplifiers are well known.

The non-inverting output of the TIA 56 is also coupled to the inverting input (/In) of the amplifier 62 via a relatively high-value resistor (e.g., 1K ohms) 64. A low value (e.g., 10 ohms) resistor 66 is coupled in parallel with resistor 64 when MOSFET switch 68 is closed, causing the parallel resistance to be approximately 10 ohms. A second MOSFET switch 70 is coupled between the differential inputs of the amplifier 62 to cause the inputs of the amplifier 62 to temporarily have the same voltage to enable a much faster threshold acquisition.

A low pass (LP) filter capacitor 72 (e.g., 800 pF) is coupled to the inverting input of the amplifier 62 to create either a relatively slow RC time constant when coupled to resistor 64 (switch 68 off) or a fast RC time constant when coupled to resistor 66 (switch 68 on).

Switch 70 has its control terminal coupled to the conventional programmable reset 1 signal generated by the GPON MAC 40 (FIG. 1) to signal the beginning of a new packet burst. The reset 1 signal is a pulse having a duration that lasts sometime between the termination of a previous packet and the approximate start of the next packet. The reset 1 signal pulse occurs during the predetermined guard time between packets in accordance with the protocol. The reset 1 signal is used by any circuitry within the OLT to reset the protocol algorithm and any other circuitry in preparation for processing a new burst of data, typically from a different ONU. The reset 1 signal is deasserted by the MAC immediately before or proximate to the start of the preamble bits (44 bits in GPON), which are used to establish bit synchronization.

Switch 68 has its control terminal connected to a stretched reset signal (reset 2), where the stretched time causes the reset 2 signal to remain asserted for a predetermined time after the reset 1 signal pulse has been deasserted. The reset 2 signal is deasserted sometime within the preamble time after the threshold voltage has stabilized to allow bit synchronization.

The reset signal 2 is asserted almost immediately after the reset 1 signal is asserted, A pulse stretcher circuit 76 receives the reset 1 signal from the MAC 40, causing MOSFET switch 78 to turn on. Resistor 80 is a relatively high-value pull-up resistor (e.g., 1K ohms). Switch 78 turning on immediately causes switch 82 to be off. Pull-up resistor 84 then asserts a high reset 2 signal to turn switch 68 on to create a fast RC time constant low pass filter. This occurs approximately simultaneously with the reset 1 signal being asserted, with any delay in the assertion of the reset 2 signal being caused by parasitic capacitances.

The reset 2 signal is coupled to the enable terminal (/EN) of the limiting amplifier 62. Asserting the reset 2 signal therefore disables the limiting amplifier 62 since it is assumed the data will have errors prior to the threshold voltage being established by the low pass filter.

The pulse-stretching function of circuit 76 operates as follows. Once the reset 1 signal is deasserted and switch 78 turns off, the turning on of switch 82 is delayed by the charging of capacitor 92 (e.g., 2 pF) through resistor 80. The values of the capacitor 92 and resistor 80 determine the delay. Once capacitor 92 has charged to a certain level, the capacitor voltage turns on switch 82 to deassert the reset 2 signal.

Thus, after the reset 1 pulse is deasserted, the stretched reset 2 signal remains asserted. As a result, as soon as the reset 1 signal is deasserted, switch 70 turns off to stop shorting together the limiting amplifier 62 input terminals, the limiting amplifier 62 remains disabled by a high /EN signal, and the low pass filter has a fast time constant (switch 68 is on by a high reset 2 signal).

The TIA 56 then receives the new packet of pulses from an ONU, starting with the preamble bits. The capacitor 72, forming the low pass filter with the fast RC time constant through resistor 66, quickly charges to the average level of the preamble bits to establish a DC threshold for the limiting amplifier 62. While the capacitor 72 voltage is ramping up, the limiting amplifier 62 is disabled by the reset 2 signal so there are no bit errors.

The circuit 76 operates as a timing generator for the switching control signals, where the timing is triggered by the burst indicator signal (reset 1 signal). The circuit 76 has a minimum number of components and is therefore extremely small. The circuit 76 may be used in any application that requires a stretched pulse signal.

Figure 4A:
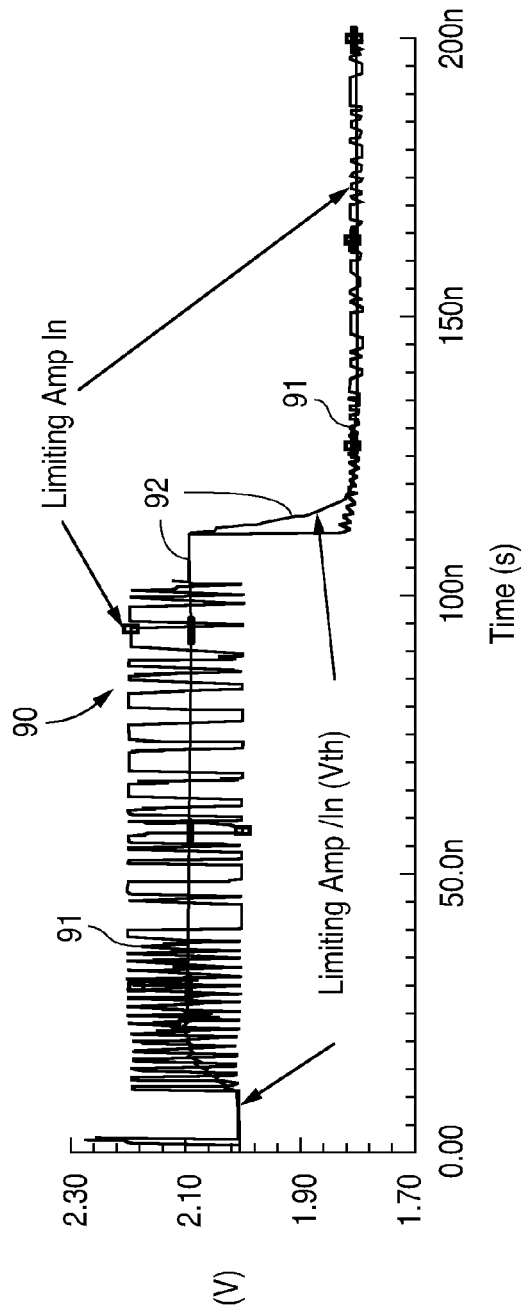
FIGS. 4a-4c illustrates: 1) sample waveforms of the analog signal output from the transimpedance amplifier for two sequential packets with the low pass filter voltage superimposed over the analog signals; 2) the reset 1 and reset 2 signals; and 3) the digital signals output by the limiting amplifier.
Figure 4B:
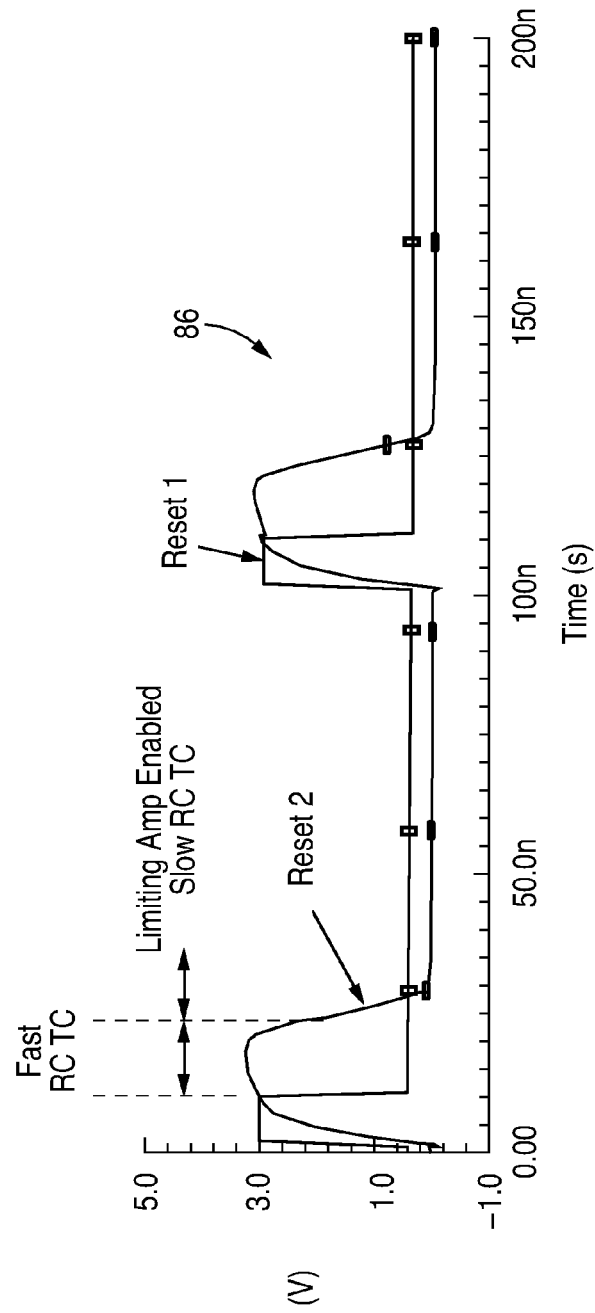
Figure 4C:
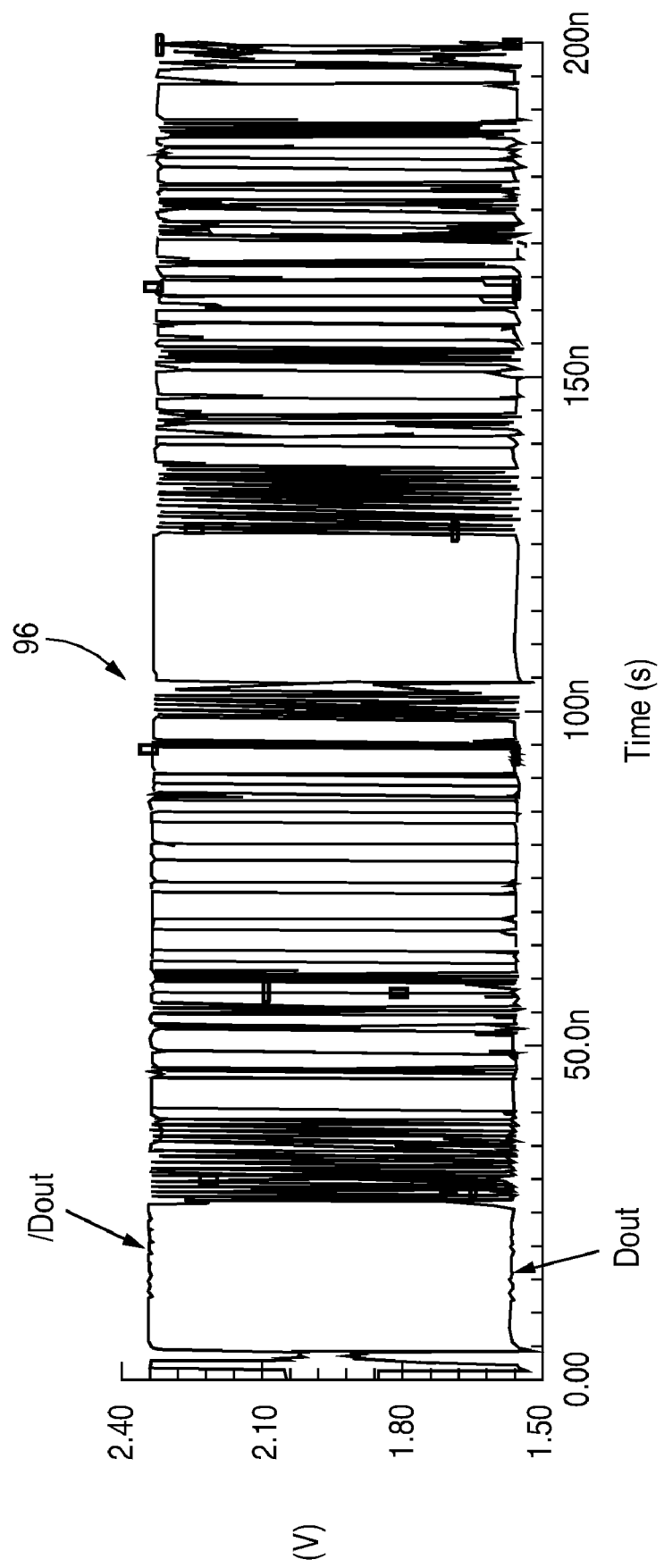

FIG. 4 shows abbreviated simulated graphs. The number of pulses in the packets of FIG. 4 does not coincide with the pulses in an actual GPON packet. FIG. 4 illustrates a graph 86 of the reset 1 signal pulse and the stretched reset 2 signal pulse vs. time. It is assumed that all circuits trigger at the midpoint of a ramping waveform. Graph 90 illustrates the analog signal 91 at the non-inverting input (In) of the limiting amplifier 62 for two sequential bursts from two ONUs. The time 0.00 to 10 nsec is a guard time between bursts. The preamble bits begin at 10 nsec, and the delimiter bits (followed by the payload data) begin at about 40 nsec. The reset 1 signal is deasserted at about 10 nsec to begin the low pass filtering by capacitor 72.

Graph 90 also illustrates the voltage 92 at the filter capacitor 72, which is the threshold voltage applied to the inverting input (/In) of the limiting amplifier 62. The threshold voltage becomes stable at about 25 nsec. The stretched reset 2 signal is set so that the reset 2 signal is deasserted shortly after the threshold voltage has become stable.

Deasserting the reset 2 signal enables the limiting amplifier 62 (/EN becomes low) and turns off switch 68. Turning off switch 68 removes the low value resistor 66 from the filter so that the RC time constant is determined by the high value resistor 64. Thus, the low pass filter becomes very stable and is not significantly affected by a long string of 1s or 0s in the packet.

As seen in the graphs 86 and 90 of FIG. 4, the reset 2 signal is deasserted at approximately 25 nsec, sometime during the preamble. As soon as the reset 2 signal switches low, the slow RC time constant and the limiting amplifier 62 are enabled. Switching of circuitry is assumed to occur at approximately the midpoint of the reset 2 signal amplitude.

Once the limiting amplifier 62 is enabled, accurate Dout and inverted Dout (/Dout) digital signals from the limiting amplifier 62 are generated, as shown in graph 96 of FIG. 4.

The invention allows for a very fast generation of an accurate threshold voltage using a low pass filter with a fast time constant, followed by switching to a slow RC time constant once the threshold is established to generate a very stable threshold voltage. The circuit also disables the limiting amplifier 62 until the stable threshold voltage is established.

In graph 90 of FIG. 4, the packet ends at about 100 nsec, followed by a guard time and another packet at about 110 nsec. The second packet is from a much more distant ONU so the light signals and the proportional electrical signals from the TIA 56 have a lower magnitude. As before, the reset 1 signal and stretched reset 2 signal cause the lower threshold voltage 92 to be quickly established shortly after the preamble bits begin. At about 125 nsec, the deassertion of the reset 2 signal provides a stable threshold voltage (slow RC time constant) and enables the limiting amplifier 62, as shown in graph 96.

In another embodiment, the limiting amplifier 62 may be enabled shortly before or after the RC time constant is made slower, as long as an accurate threshold has first been established.

Figure 5:
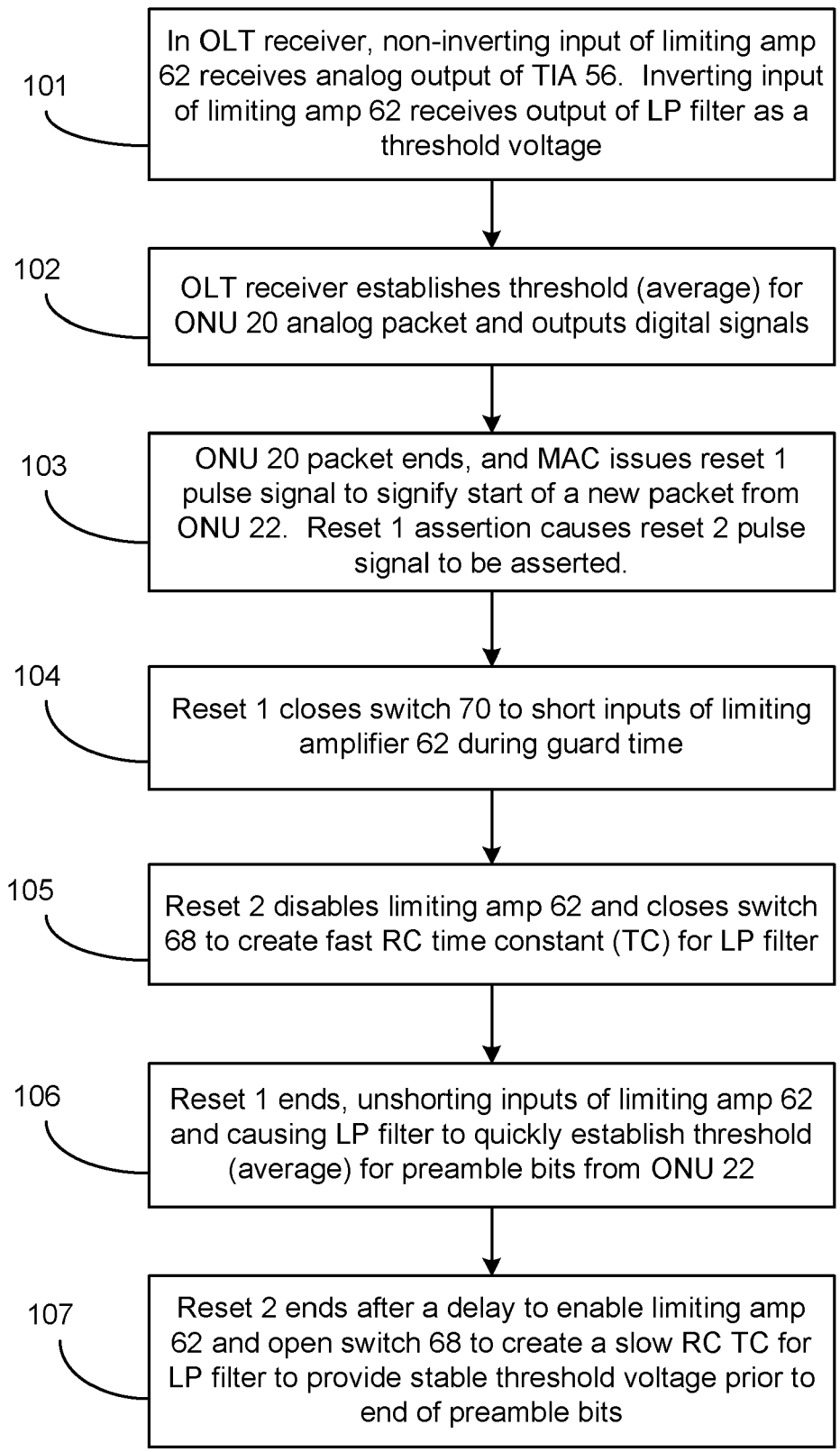
FIG. 5 is a flowchart describing the receiving of a new packet by the receiver of FIG. 3 from an ONU.

FIG. 5 is a self-explanatory flowchart summarizing in steps 101-107 the process described above.

There are many ways to implement the low pass filter, the pulse stretcher circuit, the switching circuits, and the amplifiers while still using the concepts described herein. For example, multiple low pass filters may be used and selectively switched in, or multiple switches may switch in/out the various resistors. Switched capacitors or inductors may also be used to control the time constants. The filter may even use components other than capacitors and inductors.

The particular limiting amplifier used in the circuit example is Micrel's burst-mode 1.25 Gbps PECL limiting amplifier, SY88903AL. This device features fast signal recovery, fast loss-of-signal indicator, and can be directly interfaced with other stand-alone burst-mode TIAs. Limiting amplifiers or other types of comparators with similar capabilities are also suitable.

Although NMOS transistors are shown in the example, any type of MOSFET or other transistor may be used with slight changes in the circuitry. Further, the reset 1 signal may be used instead of the reset 2 signal to turn on switch 68. Although the invention is particularly applicable for GPON systems due to the high data rates, the invention can be used in any other system, optical or non-optical, where a threshold voltage must be quickly set followed by stabilizing the threshold voltage using a low pass filter with a slower time constant.

It is noted that the signals applied to the noninverting and inverting inputs of the various components can be reversed, and the receiver will still generate digital signals that may or may not need to be ultimately inverted, depending on the desired polarity of the signals.

Figure 6:
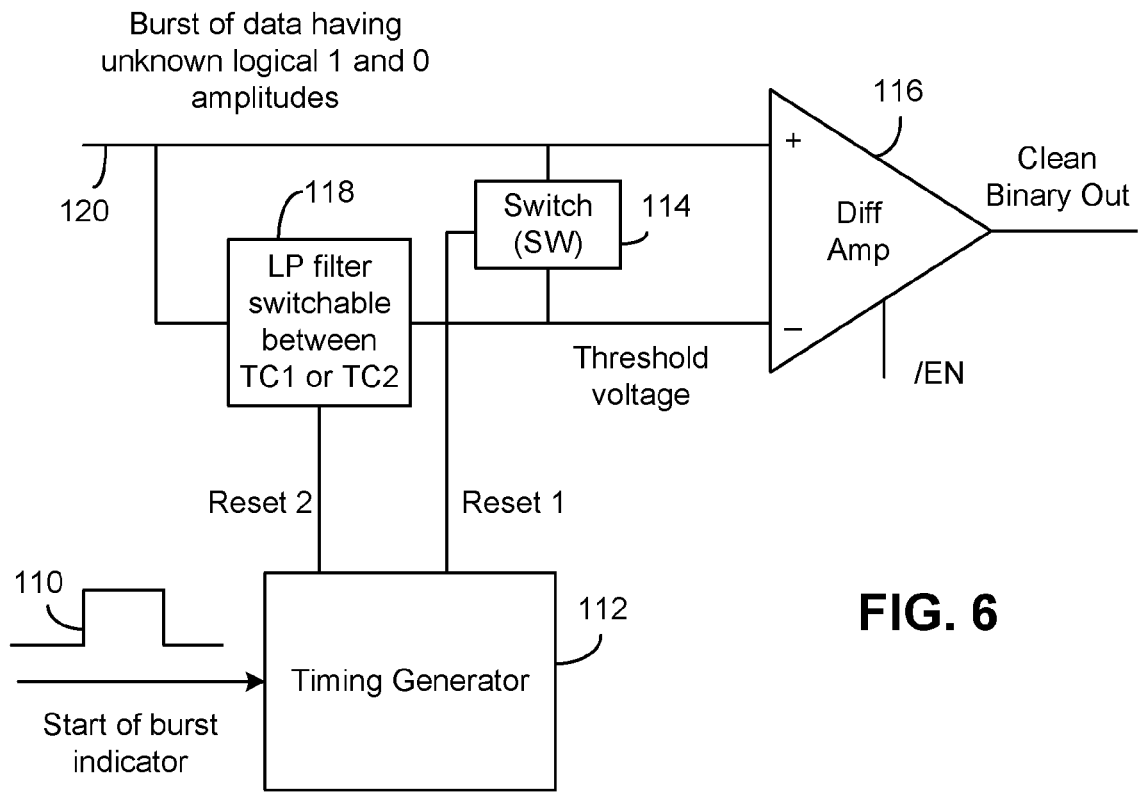
FIG. 6 illustrates a more general receiving system for any suitable application.
Figure 7:
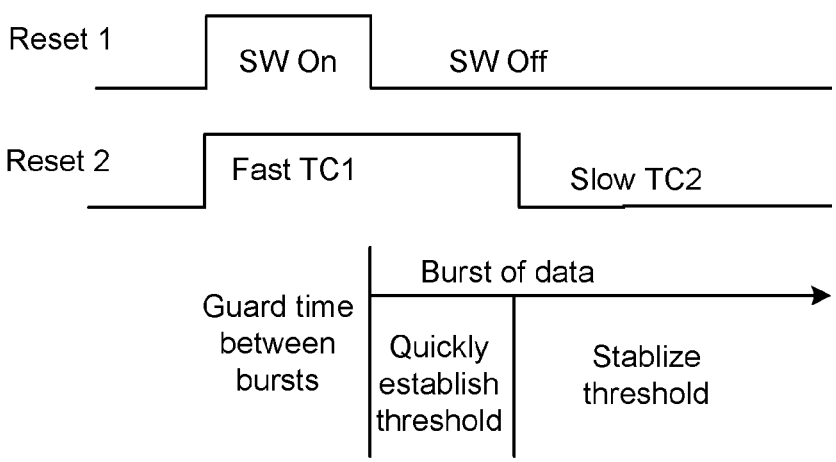
FIG. 7 illustrates the reset 1 and reset 2 waveforms that may be used in the embodiment of FIG. 6.

FIGS. 6 and 7 illustrate a more general type of circuit that embodies the invention.

In FIG. 6, at the end of a guard time period between bursts of data, a burst indicator signal 110 from an external source indicates that a burst is about to start. In the example given, the signal 110 is high for all or a portion of the guard time, and the transition to logic "low" of the signal 110 indicates a burst is about to begin. The signal 110 is applied to a timing generator 112. During the guard time, the reset 1 signal generated by the timing generator 112 causes a switch 114 to short the inputs of a differential amplifier 116 together to essentially reset a low pass filter 118 to a starting level (see FIG. 7). The use of the reset 1 signal may be optional depending on the particular circuit and application. In one embodiment, the reset 1 signal is the same as the burst indicator signal 110.

The timing generator 112 outputs a reset 2 signal that controls the low pass filter 118 to have a fast time constant at the start of the burst of data. In the example of FIG. 7, the reset 2 signal is generated during the guard time and remains asserted for a short time into the burst. The reset 2 signal may also be used to keep the differential amplifier 116 disabled until the low pass filter 118 outputs a stable voltage. Disabling the amplifier 116 may be optional if downstream circuitry has the ability to ignore data at the start of the burst while the low pass voltage is stabilizing.

A burst of data is then applied to the input terminal 120 from any source (not limited to a PON system). The data applied to terminal 120 may have a wide range of DC offsets, DC thresholds, and peak to peak magnitudes, which may vary from burst to burst. The data is applied to one input of the differential amplifier 116. The low pass filter 118 quickly establishes a DC threshold voltage from the burst of data, and this decision threshold voltage is applied to the other input of the differential amplifier 116. After a short period, it is assumed that threshold voltage has stabilized. At this time, the low pass filter 118 is switched to a much slower/longer time constant by the reset 2 signal generated by the timing generator 112, and the differential amplifier 116 is enabled by, for example, the reset 2 signal. The differential amplifier 116 now outputs accurate digital data having fixed upper and lower voltage levels. The threshold voltage will be stable despite long strings of 1's and 0's in the bursts of data.

The timing signals may take any form and are not limited to the shapes and durations shown in the examples.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A receiver for receiving a signal conveying bursts of binary information, detecting logic levels of the binary information, and outputting a digital signal, the receiver comprising:

a first node for receiving bursts of binary information;

a differential limiting amplifier having a first input terminal and a second input terminal, the first node being coupled to the first input terminal, the limiting amplifier for outputting digital signals having predetermined magnitudes;

a low pass filter coupled between the first node and the second input terminal, the low pass filter filtering the binary information in a burst and generating a threshold voltage for determining logical states of the binary information, the low pass filter having at least a first time constant and a second time constant, the first time constant being faster than the second time constant; and a timing generator for receiving a first signal indicating a start of a burst of binary information and, in response to the first signal, generating at least a second signal from the first signal, at least the second signal being coupled to the low pass filter, the low pass filter having the first time constant while receiving a first portion of the burst of binary information to generate a threshold voltage for the limiting amplifier, the timing generator then generating the second signal to cause the low pass filter to have the second time constant for stabilizing the threshold voltage while receiving a second portion of the burst of binary information, wherein the low pass filter comprises at least a filter capacitor, a first resistance, and a second resistance, wherein the second resistance is higher than the first resistance, wherein the first resistance is coupled between the first node and the capacitor during the first portion of the burst of binary information to create the first time constant, and the second resistance is coupled between the first node and the filter capacitor during the second portion of the binary information to create the second time constant, and wherein the first resistance comprises a first resistor of a first value in parallel with a second resistor of a second value, wherein the first value is less than one-tenth the second value, and the second resistance comprises only the second resistor.

2. A receiver for receiving a signal conveying bursts of binary information, detecting logic levels of the binary information, and outputting a digital signal, the receiver comprising:

a first node for receiving bursts of binary information;

a differential limiting amplifier having a first input terminal and a second input terminal, the first node being coupled to the first input terminal, the limiting amplifier for outputting digital signals having predetermined magnitudes;

a low pass filter coupled between the first node and the second input terminal, the low pass filter filtering the binary information in a burst and generating a threshold voltage for determining logical states of the binary information, the low pass filter having at least a first time constant and a second time constant, the first time constant being faster than the second time constant;

a timing generator for receiving a first signal indicating a start of a burst of binary information and, in response to the first signal, generating at least a second signal from the first signal, at least the second signal being coupled to the low pass filter, the low pass filter having the first time constant while receiving a first portion of the burst of binary information to generate a threshold voltage for the limiting amplifier, the timing generator then generating the second signal to cause the low pass filter to have the second time constant for stabilizing the threshold voltage while receiving a second portion of the burst of binary information; and a control circuit for generating the first signal indicating a start of a burst of binary information, wherein the control circuit comprises a media access controller (MAC) carrying out a communication protocol.

3. A receiver for receiving a signal conveying bursts of binary information, detecting logic levels of the binary information, and outputting a digital signal, the receiver comprising:

a first node for receiving bursts of binary information;

a differential limiting amplifier having a first input terminal and a second input terminal, the first node being coupled to the first input terminal, the limiting amplifier for outputting digital signals having predetermined magnitudes;

a low pass filter coupled between the first node and the second input terminal, the low pass filter filtering the binary information in a burst and generating a threshold voltage for determining logical states of the binary information, the low pass filter having at least a first time constant and a second time constant, the first time constant being faster than the second time constant; and a timing generator for receiving a first signal indicating a start of a burst of binary information and, in response to the first signal, generating at least a second signal from the first signal, at least the second signal being coupled to the low pass filter, the low pass filter having the first time constant while receiving a first portion of the burst of binary information to generate a threshold voltage for the limiting amplifier, the timing generator then generating the second signal to cause the low pass filter to have the second time constant for stabilizing the threshold voltage while receiving a second portion of the burst of binary information, wherein the first signal is a pulse having a first duration, wherein the timing generator comprises a pulse stretcher circuit that receives the first signal and outputs the second signal having a second duration longer than the first duration, wherein the stretcher circuit comprises a capacitor and resistor whose values determine the second duration of the second signal.

4. A receiver for receiving a signal conveying bursts of binary information, detecting logic levels of the binary information, and outputting a digital signal, the receiver comprising:

a first node for receiving bursts of binary information;

a differential limiting amplifier having a first input terminal and a second input terminal, the first node being coupled to the first input terminal, the limiting amplifier for outputting digital signals having predetermined magnitudes;

a low pass filter coupled between the first node and the second input terminal, the low pass filter filtering the binary information in a burst and generating a threshold voltage for determining logical states of the binary information, the low pass filter having at least a first time constant and a second time constant, the first time constant being faster than the second time constant; and a timing generator for receiving a first signal indicating a start of a burst of binary information and, in response to the first signal, generating at least a second signal from the first signal, at least the second signal being coupled to the low pass filter, the low pass filter having the first time constant while receiving a first portion of the burst of binary information to generate a threshold voltage for the limiting amplifier, the timing generator then generating the second signal to cause the low pass filter to have the second time constant for stabilizing the threshold voltage while receiving a second portion of the burst of binary information, wherein the limiting amplifier has an enable control terminal, the enable terminal being coupled to receive the second signal such that a transition of the second signal enables the limiting amplifier at approximately a same time that the low pass filter is caused to have the second time constant.

5. A receiver for receiving a signal conveying bursts of binary information, detecting logic levels of the binary information, and outputting a digital signal, the receiver comprising:

a first node for receiving bursts of binary information;

a differential limiting amplifier having a first input terminal and a second input terminal, the first node being coupled to the first input terminal, the limiting amplifier for outputting digital signals having predetermined magnitudes;

a low pass filter coupled between the first node and the second input terminal, the low pass filter filtering the binary information in a burst and generating a threshold voltage for determining logical states of the binary information, the low pass filter having at least a first time constant and a second time constant, the first time constant being faster than the second time constant;

a timing generator for receiving a first signal indicating a start of a burst of binary information and, in response to the first signal, generating at least a second signal from the first signal, at least the second signal being coupled to the low pass filter, the low pass filter having the first time constant while receiving a first portion of the burst of binary information to generate a threshold voltage for the limiting amplifier, the timing generator then generating the second signal to cause the low pass filter to have the second time constant for stabilizing the threshold voltage while receiving a second portion of the burst of binary information; and a switch circuit coupled between the first input terminal and the second input terminal of the limiting amplifier, the switch circuit shorting together the first input terminal and the second input terminal between bursts of the binary information and providing an open circuit after a burst has begun.

6. The receiver of claim 5 further comprising a transimpedance amplifier generating the bursts of binary information, the transimpedance amplifier converting current into voltage, an output of the transimpedance amplifier being coupled to the first input terminal of the differential limiting amplifier.

7. The receiver of claim 5 further comprising a switch circuit connected to the low pass filter for switching the low pass filter between having the first time constant and the second time constant.

8. The receiver of claim 5 wherein the first signal comprises a pulse generated within a guard time between bursts of binary information, the first signal being deasserted at approximately a start of a burst of binary information, the second signal generated by the timing generator being deasserted by a controlled delay some time after the first signal has been deasserted.

9. The receiver of claim 5 wherein an output of the limiting amplifier is a differential signal having a predetermined range.

10. The receiver of claim 9 wherein the output of the limiting amplifier is a PECL level.

11. The receiver of claim 5 further comprising a transimpedance amplifier generating the bursts of binary information, the transimpedance amplifier converting current into voltage, and further comprising a photodetector optically coupled to an input of the transimpedance amplifier, the photodetector detecting a light output of a fiber optic cable.

12. The receiver of claim 11 further comprising the fiber optic cable optically coupled to the photodetector, the fiber optic cable being part of a passive optical network (PON).

13. The receiver of claim 12 wherein the passive optical network (PON) is a gigabit PON.

14. The receiver of claim 5 wherein the receiver is part of an optical termination in a passive optical network (PON).

15. A method performed by a receiver in a passive optical network (PON) comprising:

receiving a first signal to signify a start of a burst of light pulses from a fiber optic cable, the light pulses conveying binary information;

converting the light signal pulses to an electrical input signal;

amplifying the input signal by a transimpedance amplifier to generate an output signal at an output of the transimpedance amplifier;

applying the output signal from the transimpedance amplifier to a first input terminal of a differential limiting amplifier;

applying an output of a low pass filter to a second input terminal of the limiting amplifier, an output of the low pass filter providing a threshold voltage for determining logical states of the output signal;

causing the low pass filter to have a first time constant proximate to a start of a burst of the input signal;

causing the low pass filter to have a second time constant, slower than the first time constant, sometime after the start of the burst of the analog input signal, the first time constant causing the low pass filter to generate a threshold voltage during a first portion of the burst, and the second time constant causing the low pass filter to generate a more stable threshold voltage at a later time into the burst; and outputting by the limiting amplifier digital signals determined by relative levels of the output signal and the threshold voltage, wherein receiving a first signal to signify a start of a burst of light pulses from a fiber optic cable comprises receiving a reset signal pulse from a media access controller (MAC) carrying out a communication protocol.

16. The method of claim 15 wherein causing the low pass filter to have the first time constant at a start of a burst of input signals comprises coupling a first resistance between the output signal and a low pass filter capacitor, and wherein causing the low pass filter to have the second time constant comprises coupling a second resistance, higher than the first resistance, between the output signal and the low pass filter capacitor.

17. A method performed by a receiver in a passive optical network (PON) comprising:

receiving a first signal to signify a start of a burst of light pulses from a fiber optic cable, the light pulses conveying binary information;

converting the light signal pulses to an electrical input signal;

amplifying the input signal by a transimpedance amplifier to generate an output signal at an output of the transimpedance amplifier;

applying the output signal from the transimpedance amplifier to a first input terminal of a differential limiting amplifier;

applying an output of a low pass filter to a second input terminal of the limiting amplifier, an output of the low pass filter providing a threshold voltage for determining logical states of the output signal;

causing the low pass filter to have a first time constant proximate to a start of a burst of the input signal;

causing the low pass filter to have a second time constant, slower than the first time constant, sometime after the start of the burst of the analog input signal, the first time constant causing the low pass filter to generate a threshold voltage during a first portion of the burst, and the second time constant causing the low pass filter to generate a more stable threshold voltage at a later time into the burst;

outputting by the limiting amplifier digital signals determined by relative levels of the output signal and the threshold voltage; and disabling the limiting amplifier while the low pass filter has the first time constant and enabling the limiting amplifier at a start of the second time constant.

18. The method of claim 17 wherein an output of the limiting amplifier is a differential signal having a predetermined range.

19. The method of claim 18 wherein the output of the limiting amplifier is a PECL level.

20. The method of claim 17 wherein the passive optical network (PON) is a gigabit PON.

21. A method performed by a receiver in a passive optical network (PON) comprising:

receiving a first signal to signify a start of a burst of light pulses from a fiber optic cable, the light pulses conveying binary information;

converting the light signal pulses to an electrical input signal;

amplifying the input signal by a transimpedance amplifier to generate an output signal at an output of the transimpedance amplifier;

applying the output signal from the transimpedance amplifier to a first input terminal of a differential limiting amplifier;

applying an output of a low pass filter to a second input terminal of the limiting amplifier, an output of the low pass filter providing a threshold voltage for determining logical states of the output signal;

causing the low pass filter to have a first time constant proximate to a start of a burst of the input signal;

causing the low pass filter to have a second time constant, slower than the first time constant, sometime after the start of the burst of the analog input signal, the first time constant causing the low pass filter to generate a threshold voltage during a first portion of the burst, and the second time constant causing the low pass filter to generate a more stable threshold voltage at a later time into the burst;

outputting by the limiting amplifier digital signals determined by relative levels of the output signal and the threshold voltage; and shorting together the first input terminal and the second input terminal of the limiting amplifier between bursts.

* * * * *